United States Patent [19]

Green, Jr. et al.

[11] Patent Number: 4,506,231
[45] Date of Patent: Mar. 19, 1985

[54] SINGLE ADJUSTMENT PHASE RESOLVER WITH CONSTANT AMPLITUDE OUTPUT

[75] Inventors: Donald R. Green, Jr., North Andover, Mass.; Charles O. Stevens, II, Plaistow, N.H.

[73] Assignee: AT&T Bell Laboratories, Murray Hill, N.J.

[21] Appl. No.: 555,286

[22] Filed: Nov. 25, 1983

[51] Int. Cl.³ .................. H03G 3/20; G01R 25/04
[52] U.S. Cl. .................. 330/129; 328/155; 307/511
[58] Field of Search .................. 330/129, 278; 307/511–513; 328/155; 455/276

[56] References Cited

U.S. PATENT DOCUMENTS

| | | | |
|---|---|---|---|
| 4,157,508 | 6/1979 | Hecken | 328/142 |
| 4,232,399 | 11/1980 | Heiter | 455/276 |
| 4,313,089 | 1/1982 | Predina | 328/155 |
| 4,379,264 | 4/1983 | Lenhardt | 328/24 |
| 4,395,687 | 7/1983 | Belohoubek | 333/164 |

OTHER PUBLICATIONS

"This voltage-controlled rf attenuator", *Elec. Design* 15, Jul. 22, 1971, N. Kada, pp. 66–67.
"Need a PIN-diode attenuator?", *Electronic Design* 7, Mar. 29, 1977, R. S. Viles, pp. 100–102.
"Complex phasor modulators control amplitude and phase simultaneously", *Microwaves & RF*, Jul. 1983, J. P. Curtis, pp. 123–124.

Primary Examiner—James B. Mullins
Attorney, Agent, or Firm—John Francis Moran

[57] ABSTRACT

A single adjustment phase resolver uses common voltage control in a dual inversely tracking bridged-Tee attenuator circuit (21) to provide a variable relative phase displacement between two output signals whose amplitude levels are maintained equal and constant throughout the range of the phase adjustment. The dual bridged-Tee attenuator is implemented using two variolossers wherein the PIN diodes are serially connected in two pairs (51 and 52, 53 and 54) and the pairs are oppositely poled from one another. An automatic gain control circuit (16, 24 and 26) adjusts the input signal level to compensate for a latitude of discrepancy between the inverse tracking variolossers.

7 Claims, 3 Drawing Figures

SINGLE ADJUSTMENT PHASE RESOLVER WITH CONSTANT AMPLITUDE OUTPUT

BACKGROUND OF THE INVENTION

This invention relates to variable phase shifters and, more particularly, to an arrangement for shifting phase while maintaining a constant amplitude output independent of the phase setting.

There are numerous applications for phase shifting circuits in the fields of communications and measurements. One such application is described as a phase resolver in U.S. Pat. No. 4,157,508 issued to R. P. Hecken on June 5, 1979. The terminology of phase resolver is used since two output signal components are produced with a controlled phase relationship between them. The basic purpose of the arrangement in the Hecken patent is to provide predistortion compensation, a well-known technique in the art, for canceling the distortion introduced by the nonlinear transfer characteristics of electromagnetic devices. This technique requires precise phase control of the predistortion component to effect destructive phase interference during the signal amplification process.

The problem with conventional phase resolvers is that phase and amplitude controls are interactive. Phase control is provided by two adjustments which determine the relative magnitude of two phase displaced signals. Unfortunately when these two signals are vectorially combined, the amplitude of the output signal varies with phase setting. Therefore, a third interactive adjustment is also required in order to control the signal amplitude. Thus, setting up a predistorter and maintaining its performance level as the electromagnetic device ages is a tedious problem since the interactive property of conventional controls requires numerous repetitive resettings of controls in the process of obtaining acceptable performance from a predistorter.

SUMMARY OF THE INVENTION

Broadly, the invention is an improved phase shifting arrangement wherein a dual section attenuator with inversely tracking attenuation characteristics and an automatic gain control loop provide a constant amplitude output signal throughout the range of the variable phase shift.

In an aspect of the invention, the dual section attenuator takes the form of two variolosser circuits in a bridged-Tee configuration each including a serial pair of PIN diodes. The PIN diodes in one pair are oppositely poled with the PIN diodes in the other pair. The center portion of each pair of PIN diodes is connected to a control voltage source which controls the relative attenuation of the two sections and the amount of phase shift produced at the output of the phase shifter.

In some further aspects of the invention, the automatic gain control includes a variable gain amplifier at the input and a detector at the output for controlling the gain of the variable gain amplifier to ensure a constant amplitude output independent of the phase setting. Each diode pair is connected to an opposite polarity bias to provide inverse attenuation responses to a common central control voltage. A diode bridge circuit with a reversible biasing arrangement coupled between the variable gain amplifier and the signal splitter produces a phase reversal in the output of the phase shifter. The output signal combining means produces two outputs whose relative phase relationship is controlled by the common variable voltage potential of the two sections of the attenuator.

BRIEF DESCRIPTION OF THE DRAWING

Additional objects, features and advantages of the invention including its implementation and operation will best be understood from the following detailed description, taken in conjunction with the accompanying drawing, wherein.

DETAILED DESCRIPTION

Figure 1:
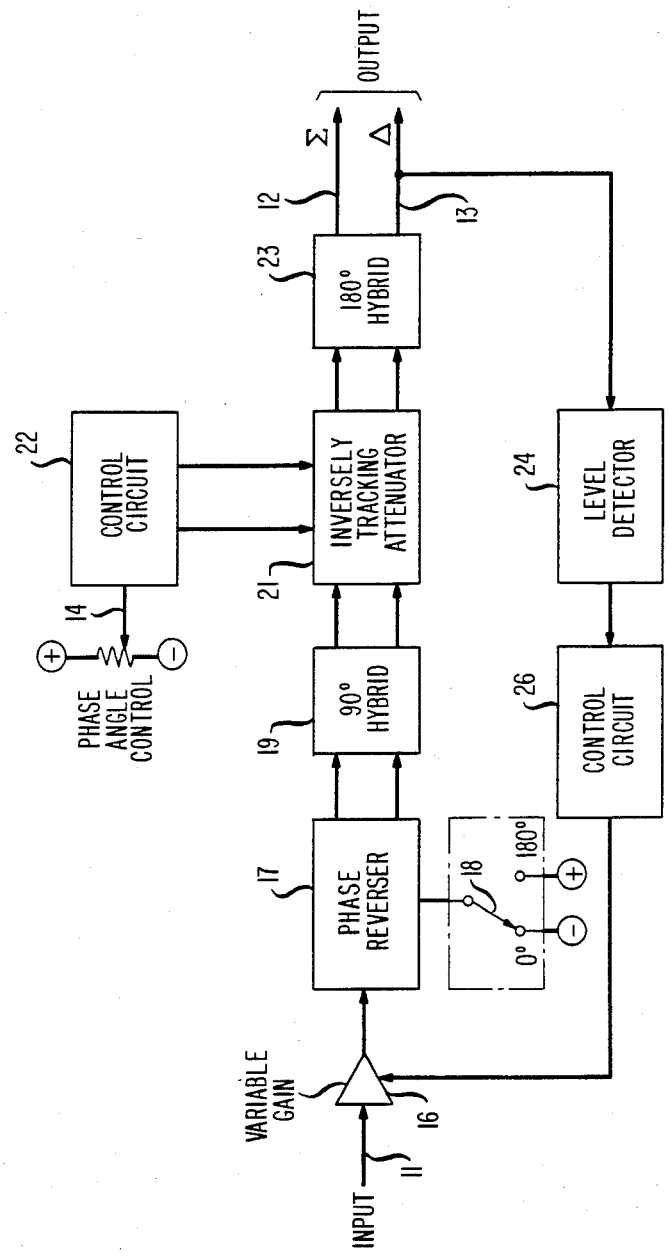
FIG. 1 is a block diagram embodying the inventive principles.

FIG. 1 is a circuit diagram of the inventive arrangement wherein an input signal applied to terminal 11 produces two output signals at terminals 12 and 13 which are displaced in phase from one another in accordance with the setting of phase angle control 14. The input signal is applied to variable gain amplifier 16 whose output is applied to phase reverser switch 17. Phase reverser 17 provides either a zero or 180 degree additional phase shift between the outputs, terminals 12 and 13, as determined by the position of switch 18. The output signal from phase reverser 17 is split into two components in quadrature phase relationship by hybrid 19. Each component is separately applied to inversely tracking attenuator 21 and their relative magnitudes are varied by phase angle control 14 acting through control circuit 22. Two signal components are separately applied to output hybrid 23 wherein the sum signal and the difference signal are produced at respective terminals 12 and 13. Although the two outputs are equal in magnitude, the relative phase displacement from one another is provided by changing the magnitude relationship between the two output signal components applied to attenuator 21. In accordance with the inventive principles inversely tracking attenuator 21 includes two variable attenuator sections which track in inverse relationship to one another so as to produce a relatively constant output from the hybrid when the phase adjustment is varied. The constancy of the output signal amplitude is further insured by level detector 24 and control circuit 26 which control the magnitude of the input signal applied to phase reverser 17 by changing the gain of amplifier 16.

Figure 2:
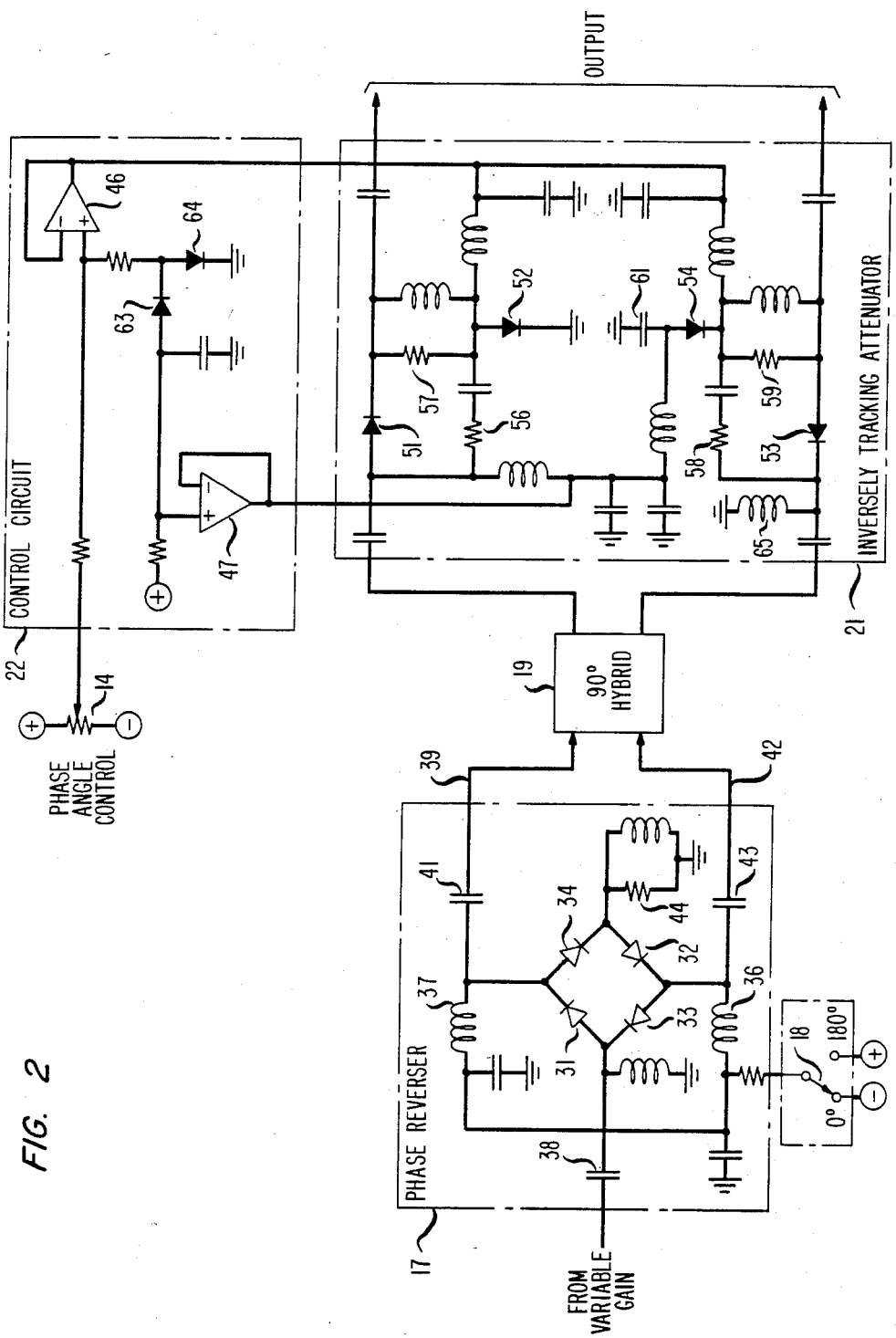
FIG. 2 provides a schematic diagram of a portion of FIG. 1.

FIG. 2 provides detailed schematics of phase reverser 17 and inversely tracking attenuator 21 including control circuit 22. Basically, the phase reverser is a bridge circuit including diodes 31, 32, 33 and 34 which feed hybrid 19. The bridge circuit is biased either negatively or positively by switch 18 which is coupled to the bridge by chokes 36 and 37. Chokes 36 and 37 provide low impedance for the dc bias while blocking the radio frequency signal current which in the particular application of the invention is 70 MHz. 70 MHz is the IF frequency for radio transmission systems.

When switch 18 is in the zero degree position, a negative bias is applied to the bridge via chokes 36 and 37. Diodes 31 and 32 are then forward biased so that the input signal coupled to the bridge via capacitor 38 is coupled to terminal 39 of hybrid 19 via capacitor 41. Diode 32 is also forward biased and provides the characteristics impedance termination through resistor 44 for terminal 42 of hybrid 19 via capacitor 43. The other two diodes in the bridge, 33 and 34, are reverse biased and are essentially open circuits.

When switch 18 is in the 180 degree position, a positive bias is applied to the bridge via chokes 36 and 37 and diodes 33 and 34 are now forward biased. In this case, the input signal from capacitor 38 is coupled to terminal 42 of hybrid 19 through the path of forward biased diode 33 and capacitor 43. On the other side of the bridge, diode 34 provides the resistive termination through resistor 44 for terminal 39. At this time, diodes 31 and 32 are reverse biased. The bias reversal on the bridge circuit of phase reverser 17 provides the functional equivalent of a double-pole-double-throw switch at the input of hybrid 19.

The output of hybrid 19 is applied to inversely tracking attenuator 21 which comprises two PIN diode voltage controlled bridged-Tee variolossers. The two variolossers are driven and biased from dual operational amplifiers 46 and 47 in control circuit 22. The attenuation levels are controlled by varying the electrical bias on the PIN diode pairs in each variolosser which is adjusted by phase angle control 14. The first bridged-Tee circuit of inversely tracking attenuator 21 includes diodes 51 and 52 which wil be called the non-inverted variolosser. The other bridged-Tee circuit includes diodes 53 and 54 which are connected in reverse polarity and will be called the inverted variolosser. In each variolosser, respective diode 51 and diode 53 is the series element while diodes 52 and 54 are the shunt elements. At the input signal frequency, the PIN diodes function as current-controlled resistors whose resistance may be varied over a range of a few ohms to several thousand ohms. The minority-carrier lifetime of the PIN diodes is chosen to be relatively long for the frequency of operation so that the diodes will act strictly as current-controlled resistors instead of as rectifiers.

The diode pair in each variolosser is biased so that as the resistance of the series element increases, the resistance of the shunt element decreases and vice-versa. Since the diodes in one variolosser are oppositely connected with respect to the other variolosser, the two variolossers tend to have inverse tracking characteristics. In other words, as one variolosser increases the attenuation of the signal the other variolosser decreases signal transmission loss through it. Thus one variolosser is termed the non-inverted while the other is the inverted. In the non-inverted variolosser, the values of resistors 56 and 57 determine the nominal input and output characteristic impedance of that bridged-Tee section while similarly resistors 58 and 59 determine the transmission impedance characteristic of the other variolosser.

It may be observed from the circuit of FIG. 2 that phase angle control 14 is common to both the inverted and non-inverted variolossers and biases the diodes in series pairs (i.e., diodes 51 and 52 in one pair and diodes 53 and 54 in the other pair). Due to the inverted configuration, the control voltage produced by the output of amplifier 46 is applied at the point between the diodes in both diode pairs but in one pair as the voltage increases across the series element, it decreases across the series element of the other pair. The same inverse relationship occurs with shunt diodes 52 and 54. It is important in this circuit that the total bias voltage across the individual diode pairs remains relatively fixed, so that a constant impedance is maintained. This bias voltage is the voltage produced at the output of amplifier 47 which is connected in a voltage follower configuration with unity gain and as long as the individual diodes have similar characteristics, then the return loss of the individual variolossers will be acceptable without special attention given each variolosser.

Diode 54 has an RF bypass capacitor 61 connected to the anode terminal so that a dc bias voltage can be applied and still maintain a good RF ground at that point. Choke 65 in the inverted variolosser serves as a DC return to ground for the bias voltage while providing an RF block from the signal path. In control circuit 22, diodes 63 and 64 are used as reference diodes and are chosen to have silicon junction characteristics similar to PIN diodes 51–54 so that the attenuation setting in the individual variolossers is maintained constant when the ambient temperature of the circuit varies. It should be noted that the remaining circuit components such as coupling capacitors, bias chokes, and by-pass capacitors are respectively utilized at various points in the circuitry of attenuator 21 to provide appropriate RF coupling, DC coupling and RF blocking, and RF by-passing in the circuit.

Figure 3:
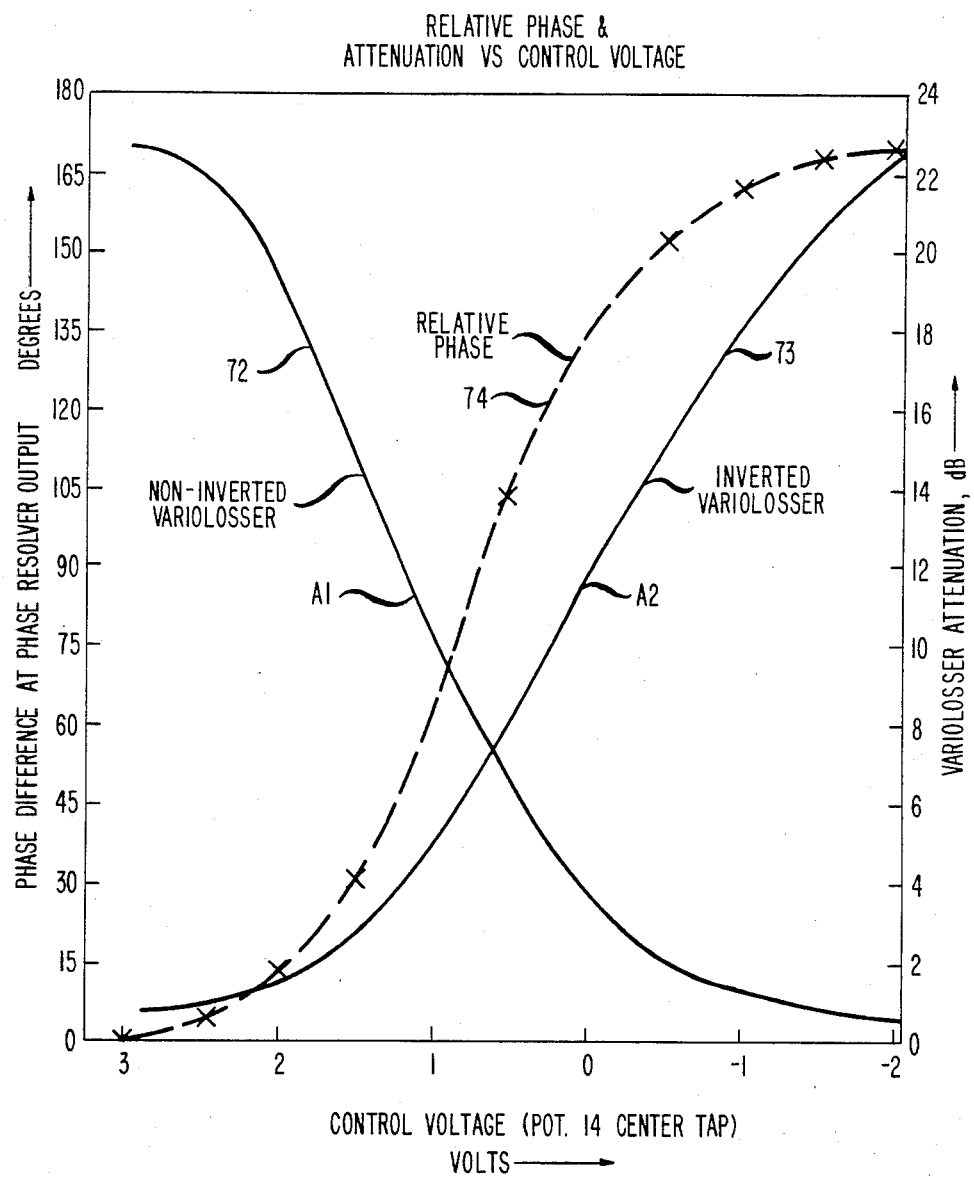
FIG. 3 provides characteristic curves demonstrating the electrical proprieties provided by the circuitry of FIGS. 1 and 2.

FIG. 3 depicts the attenuation characteristics of the two bridged-Tee variolosser sections as a function of common control voltage. More particularly, curve 72($A_1$) represents the attenuation characteristic for the non-inverted variolosser, which includes diodes 51 and 52 in FIG. 2, and curve 73 ($A_2$) represents an inverse characteristic for the inverted variolosser. Curve 74 illustrates the relative phase displacement between the output signals provided by terminals 12 and 13 of FIG. 1 as a function of control voltage.

In order for the output voltage to remain constant over the phase range of curve 74, it is necessary to comply with the restriction that the sum of the squares of $A_1$ and $A_2$ remain constant. Since it is difficult to implement a variolosser which will completely maintain this restriction, the automatic gain control feedback loop comprising level detector 24, control circuit 26, and variable gain amplifier 16 provide relatively minor adjustment of the level of the input signal to compensate for discrepancies in the attenuator tracking. Another benefit from the inverse tracking characteristics is that overall signal attenuation in the phase resolver of FIG. 1 is minimized.

What is claimed is:

1. A phase shifting circuit comprising:
   signal splitting means for receiving an incoming signal and providing two signal components in substantially quadrature phase relationship to each other;
   adjustable attenuator means comprising two sections, one for each of the two signal components, controlled by a single adjustment and adapted to have inversely tracking attenuation characteristics to produce an output indicative of a substantially constant vector summation of the two signal components as the relative magnitude between the two signal components is varied;
   signal combining means for adding in specific phase relationship the two signal components from the two attenuator sections to produce a phase shifted output from the phase of the incoming signal in accordance with the relative magnitude relationship presented thereto; and automatic gain adjustment means for sensing the magnitude of the phase shifted output and changing the magnitude of the incoming signal to maintain a constant output magnitude while its phase is varied.

2. The phase shifting circuit according to claim 1 wherein the two adjustable attenuator sections each comprise a bridged-Tee configured variolosser, each including a serial pair of PIN diodes, and the PIN diodes in one pair are oppositely poled with respect to the PIN diodes in the other pair.

3. The phase shifting circuit according to claim 2 wherein the single adjustment comprises a potentiometer disposed between opposite polarity voltage potentials and an operational amplifier having an input connected to the variable tap of the potentiometer and an output in circuit with the center portion of each pair of PIN diodes.

4. The phase shifting circuit according to claim 3 wherein the automatic gain adjustment means comprises a variable gain amplifier preceding the signal splitting means and level detector means connected to receive the phase shifted output and controlling the gain of the variable gain amplifier to ensure a constant amplitude output throughout the range of the relative magnitude relationship.

5. The phase shifting circuit of claim 4 further including biasing means coupled to each diode pair for providing oppositely polarity bias responses to a common central voltage.

6. The phase shifting circuit of claim 4 further comprising a diode bridge circuit disposed between the variable gain amplifier and the signal splitting means, and biasing means for forward biasing diodes in opposite branches of the diode bridge, the biasing means producing a first polarity potential and a second polarity potential to produce a reversal in signal coupling between the variable gain amplifier and the signal combining means to produce a one hundred eighty degree phase shift in the output of the phase shifting circuit.

7. The phase shifting circuit of claim 5 wherein the signal combining means includes two outputs, one indicative of the in-phase sum of the two signal components, and one indicative of the one hundred eighty degree phase difference of the two signal components whereby the phase shifted output is provided by the phase displacement between the two outputs of the signal combining means.

* * * * *